US012276696B2

(12) United States Patent
Yap et al.

(10) Patent No.: US 12,276,696 B2
(45) Date of Patent: Apr. 15, 2025

(54) DEFECT DETECTION USING THERMAL LASER STIMULATION AND ATOMIC FORCE MICROSCOPY

(71) Applicant: Intel Corporation, Santa Clara, CA (US)

(72) Inventors: Huei Hao Yap, Albuquerque, NM (US); Gavin Corcoran, Albuquerque, NM (US); Jungwon Kim, Albuquerque, NM (US); Seung Hwan Lee, Albuquerque, NM (US); Mark Gruidl, Rio Rancho, NM (US); Karthik Kalaiazhagan, Albuquerque, NM (US); Youren Xu, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 253 days.

(21) Appl. No.: 17/896,098

(22) Filed: Aug. 26, 2022

(65) Prior Publication Data

US 2024/0069095 A1 Feb. 29, 2024

(51) Int. Cl.
*G01R 31/311* (2006.01)
*G01Q 10/04* (2010.01)
*G01Q 20/02* (2010.01)
*G01Q 60/38* (2010.01)

(52) U.S. Cl.
CPC ......... *G01R 31/311* (2013.01); *G01Q 10/04* (2013.01); *G01Q 20/02* (2013.01); *G01Q 60/38* (2013.01)

(58) Field of Classification Search
CPC .... G01R 1/071; G01R 31/26; G01R 31/2601; G01R 31/2851; G01R 31/308; G01R 31/311
See application file for complete search history.

(56) References Cited

U.S. PATENT DOCUMENTS

| 9,964,589 B1 | 5/2018 | Zhu et al. | |
| 2003/0183761 A1* | 10/2003 | Hantschel | G01Q 70/16 250/306 |
| 2006/0103378 A1* | 5/2006 | Pakdaman | G01R 31/311 324/228 |

OTHER PUBLICATIONS

Cole, Edward I. et al. "Backside Localization of Open and Shorted IC Interconnections", IEEE, 36th Annual International Reliability Physics Symposium, The Electron Device Society and the Reliability Society of the Institute of Electrical and Electronics Engineers, Mar. 31-Apr. 2, 1998, pp. 129-136, Reno, NV, USA.
Nikawa, K., "Optical beam induced resistance change (OBIRCH): overview and recent results", IEEE, The 16th Annual Meeting of the IEEE Lasers and Electro-Optics Society (2003), Oct. 27-28, 2003, pp. 742-743, Tucson, AZ, USA.

(Continued)

*Primary Examiner* — Tung X Nguyen

(74) *Attorney, Agent, or Firm* — Viering, Jentschura & Partner mbB

(57) ABSTRACT

The present disclosure is directed to an inspection tool having an integrated optical laser unit and atomic force probe unit with a detector unit. The inspection tool further includes a processor unit that is coupled to the optical laser unit and the atomic force probe unit and performs a fault location analysis for a device under test. In addition, the present disclosure to methods for inspecting a device under test for defects using an inspection tool having an integrated optical laser unit and atomic force probe unit that includes a detector unit.

20 Claims, 5 Drawing Sheets

(56) References Cited

OTHER PUBLICATIONS

Hamamatsu Photonics K.K., "IR-OBIRCH analysis system", 2014, 8 pages.
Thermofisher Scientific, "Hyperion II System" Datasheet, 2018, 2 pages.
Hamamatsu Photonics K.K., "How much resolution? How wide a field-of-view?", retrieved on Jul. 18, 2022, 6 pages.
Hitachi-Hightech, "Electron Beam Absorbed Current (EBAC) Charatcerization System nanoEBAC NE4000", retrieved on Jul. 18, 2022, 6 pages.
Imina Technologies, "Defect localization at transistor gate using electron beam induced resistance change (EBIRCh)", Dec. 2020, 3 pages, vol. 1.
Koch, Ingrid, "Reduce Charging in SEM Using Low Voltage Imaging", nano Science Instruments, retrieved on Jul. 18, 2022, 5 pages.
Manabu Ishimaru et al. "Electron-beam-induced amorphization in SiC" Physical Review B, published on Oct. 6, 2003, vol. 68, Issue 14, APS Physics.

\* cited by examiner

DEFECT DETECTION USING THERMAL LASER STIMULATION AND ATOMIC FORCE MICROSCOPY

BACKGROUND

As the dimensions of semiconductor device structures shrink and become more complex, failure analysis has become increasingly critical and challenging. In particular, with the use of high-density interconnects, wafer-level stacking, flexible electronics, integral substrates, and other features, the presence of failure-inducing defects is more difficult to identify and locate. Moreover, if critical failures are identified only at the device post-packaging stage, the results may be a significant loss of yield and delays in customer delivery.

By using the right tools and techniques, the time and costs associated with electrical fault isolation may be reduced by quickly extracting comprehensive defect data from a device under test (DUT). A commonly used testing technique is scanning electron microscopy (SEM), which scans a sample with an electron beam (e-beam) to produce magnified images that may be used in microanalysis and failure analysis of semiconductors. However, there are concerns that arise from using SEM-based nano-probing including the e-beam potentially causing a static surface charge and damaging the DUT, and the e-beam affecting the electrical behavior of the DUT if sensitive materials are used, i.e., causing a phase change in such sensitive materials.

To mitigate the concerns from surface charging and e-beam damage, a low voltage e-beam is commonly used for imaging but performing the nano-probing with a low energy e-beam may not produce "crisp" images for semiconductor chip materials, and detecting defects at lower-level layers typically require the use of a high voltage e-beam. Therefore, advancements in the analytical tools and techniques for the detection of electrical and structural defects in semiconductor devices as an alternative to SEM are needed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
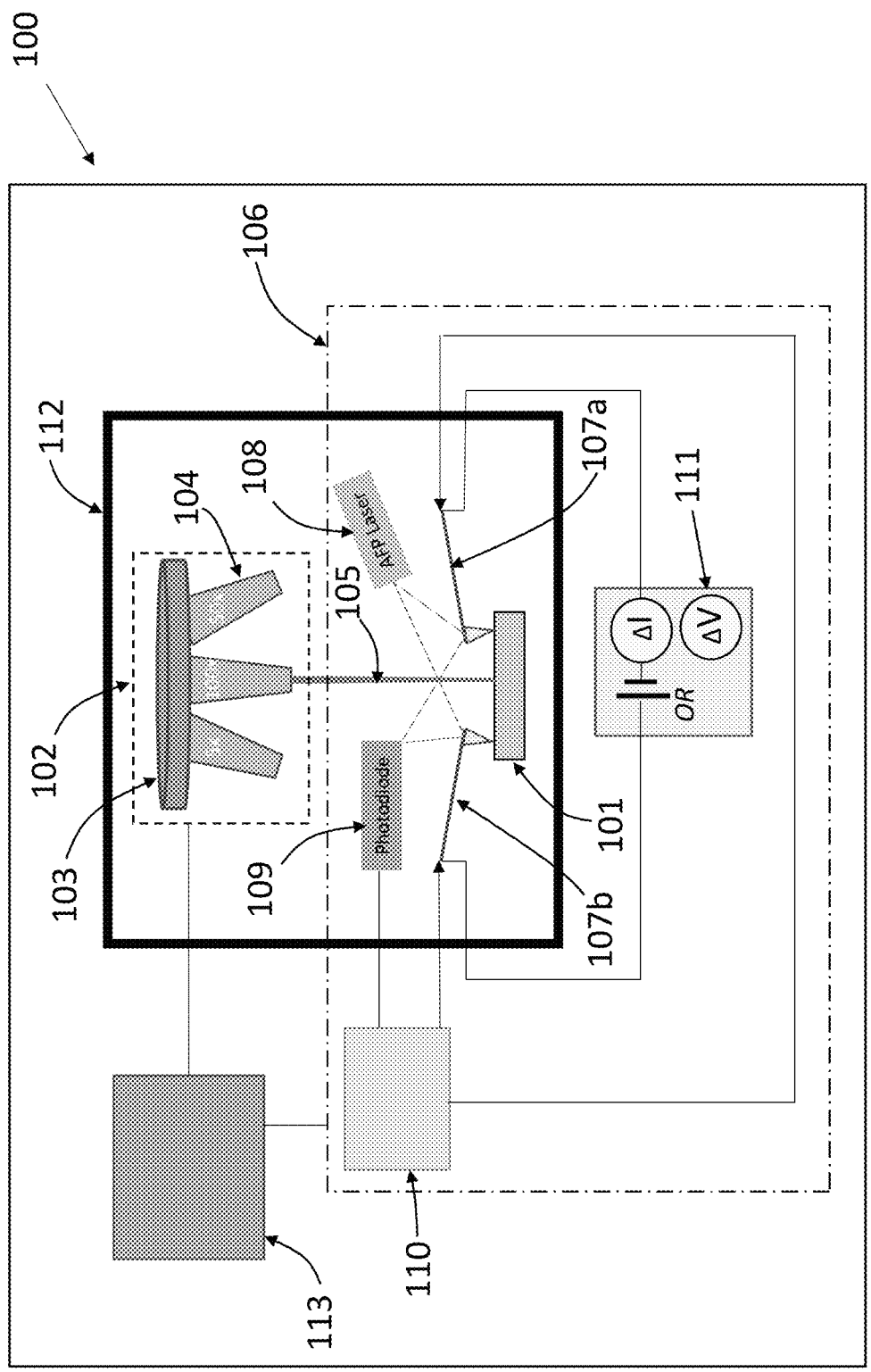
FIG. 1 shows an exemplary diagram of an integrated inspection tool according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

In an aspect, the present disclosure is directed to an inspection tool and method that uses a laser beam to detect "hotspots", which may be due to faults or defects, that may be identified while undergoing scanning to generate closed-loop circuitry (i.e., biasing) using an atomic force probe unit. The inspection tool may be an integrated optical thermal laser stimulation unit and atomic force probe (AFP) unit, which is a type of atomic force microscope. In another aspect, the present inspection tool may achieve a high spatial resolution of approximately 1.3 µm in isolating a fault or defect when high magnification laser objective lenses are directed within proximity of the faulty circuit or defect site (i.e., a region of interest) for a semiconductor device under test. A laser beam from the optical laser unit may be used for scanning the surface of the semiconductor device to generate a temperature gradient, which leads to a resistance variance that locates a "leakage" or short from the fault or defect detected by the AFP.

In another aspect, the present disclosure is directed to an inspection tool having an integrated optical laser unit and atomic force probe unit with a detector unit with a feedback function. The inspection tool further includes a processor unit that is coupled to the optical laser unit and the atomic force probe unit, and that performs a fault location analysis for a device under test. In an aspect, the optical laser unit includes a near-infrared laser and a plurality of objective lenses that range in power from low to high magnification. In another aspect, the atomic force probe unit includes a plurality of piezoelectric scanning probes that operate using a tapping mode.

In addition, the present disclosure is directed to methods for inspecting a device under test, which may be pre-sorted (i.e., selecting the device under test from a plurality of devices) and prepared for fault location analysis (i.e., performing a sample preparation process), including removing one or more layers from the device under test, for defects by providing an inspection tool having an integrated optical laser unit and atomic force probe unit that includes a detector unit and using the atomic force probe unit to scan the device and perform close loop nanoprobing to determine the locations of the defects. Thereafter, the optical laser unit performs a scan of the locations determined by the atomic force probe unit and generates localized heating in the device that may be caused by a defect in the device. The optical laser unit may be used to perform a further scan of the location determined by the atomic force probe unit to obtain a specific location for the defect.

The technical advantages of the present disclosure may include, but are not limited to:
(i) providing a new inspection tool and an improved methodology for fault location in semiconductor devices; and
(ii) avoiding the use of SEM for nano-probing of semiconductor devices when a high-voltage electron beam may cause damage to such semiconductor devices or adversely influence the fault analyses.

To more readily understand and put into practical effect the present integrated inspection tool and the methods for detection of defects in a semiconductor device, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

In FIG. 1, an exemplary inspection tool 100 according to an aspect of the present disclosure is shown. In an aspect, the inspection tool 100 includes an optical thermal laser stimulation unit or optical laser unit 102 having a rotating lens attachment or turret 103 with a lens system having a plurality of objective lenses 104, which may employ a near-infrared laser (not shown). In an aspect, the lens system may have objective lenses that range in power from low to high magnification, e.g., 5× to 100×. In an aspect, a low power objective lens may be used to generally located regions of interest (ROIs) and high power objective lenses for probing and locating hotspots on a DUT. For example, the plurality of objective lenses 104 may have a 100× optical magnification with a 12 mm working distance. In an aspect, the optical laser unit 102 may include a camera (not shown) for image capture.

In another aspect, the near-infrared objective lenses 104 may optically locate a region of interest (ROI) and identify a fault or defect (not shown) by applying a 1.3 μm laser-beam wavelength, which may have a greater than 100 mW heating capability. A laser beam 105 may cause a resistance change, based on ohm's law R=I/V, from a biased circuitry that is affected using an atomic force probe unit 106 that is integrated with the optical laser unit 102. The optical laser unit 102 may be used to capture the ROI as an "original" optical image and followed by a laser scan through the ROI again to stimulate the close loop circuitry and obtain the hotspot.

In a further aspect, the laser beam 105 may be irradiated at a device under test or DUT 101, and the generated heat may be transmitted and impeded by a defect (not shown) in device 101. The impedance change may be detected by a conventional OBIRCH amplifier (not shown) with high-sensitivity current mode down to pico-amp. With additional digital lock-in for OBIRCH analysis, it boosts detection sensitivity by converting the data from a single pixel into multiple data using software lock-in processing and may enable image captures with a high spatial resolution of 1.3 μm under 130 μm×130 μm field of view. It should be understood that it is within the scope of the present disclosure to include additional features from conventional optical thermal laser stimulation devices as part of the present optical laser unit.

Also, in FIG. 1, the inspection tool 100 includes the atomic force probe unit 106 that is integrated with the optical laser unit 102 in a chamber or operating compartment 112. The atomic force probe unit 106 includes a plurality of scanning cantilever probes 107a and 107b a laser 108 and/or photodiode 109, which is coupled to a detector/feedback unit 110, and a power source 111. The plurality of scanning cantilever probes 107a and 107b have sharp probe tips that mechanically scan across a surface of the DUT 101 and the motion of the probes may be captured with a computer or processor 113. In an aspect, the processor 113 may be an integrated unit of the inspection tool 100 or part of a semiconductor inspection system. In an aspect, the plurality of scanning cantilever probes 107a and 107b may use a raster scanning pattern over a stationary DUT 101.

In an aspect, the plurality of scanning cantilever probes 107a and 107b may include transducers (e.g., diodes) that convert the interaction force with a DUT's surface into a deformation or a change of the vibrational state of the probe. The probes may include a sharp microtip that determines the lateral resolution of an atomic force probe unit and a force transducer that provides the force sensitivity. The motion of the plurality of scanning probes 107a and 107b may be used to create three-dimensional images of the surface that may be very-high-resolution images (i.e., on the order of fractions of a nanometer) utilizing the laser light bouncing off the cantilever.

For example, the plurality of scanning cantilever probes may include piezo-driven scanning probes operating in a tapping mode. For the tapping mode, the cantilever probes may oscillate just above the surface at a higher amplitude of oscillation, which makes the deflection signals larger for the control circuit, and hence an easier control for topography feedback. Generally, there are two basic modes of imaging surface topography with an atomic force probe or microscope unit—static or contact mode and dynamic mode, with the dynamic mode being further sub-divided into tapping or intermittent contact and non-contact mode depending on the interaction forces between the scanning probe tip and the surface.

The use of piezoelectric scanning probes 107a and 107b may produce nano-range topography images and electrical measurements using software associated with the detector/feedback unit 110 to monitor/track the probes' positions on the DUT 101. In particular, the piezoelectric scanning probes 107a and 107b may perform the tapping raster scanning mode across a ROI and locate specifically targeted contacts, i.e., the probe tips being placed on the "closed loop circuitry" contacts creating two-point biasing on the defective circuitry in a "static mode", i.e., electrically biased in one direction with electron flow from negative to positive. It should be understood that it is within the scope of the present disclosure to include additional features from conventional atomic force microscopes as part of the present atomic force probe unit.

Figure 2:
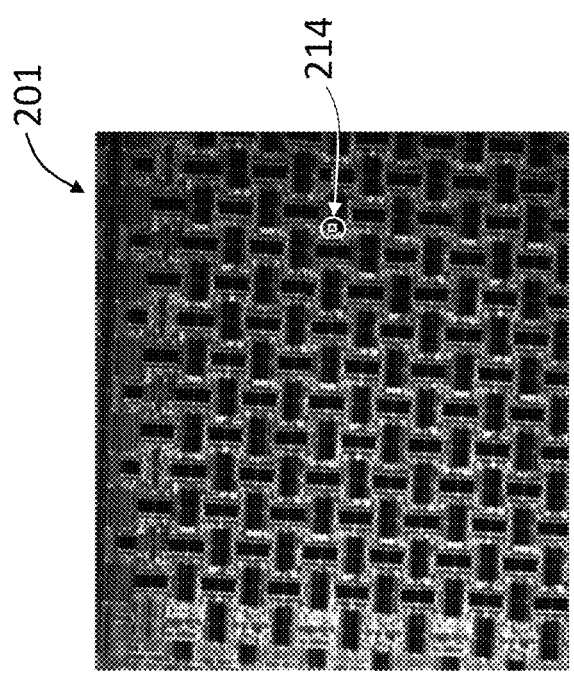
FIG. 2 shows a representative image of a thermal gradient point or hotspot for a device under test (DUT) according to an aspect of the present disclosure.

FIG. 2 shows a representative image of a thermal gradient point or hotspot 214 for a device under test (DUT) 201 according to an aspect of the present disclosure. In an aspect, a thermal laser stimulation unit employs a laser to produce thermal variations, i.e., localized heating, in locations of a semiconductor device under test (DUT) containing leakages and/or shorts. The heat changes the circuit current (I) & voltage (V) characteristics, which may be plotted onto an image, a defect map of "hotspots" in the device corresponding to the positions of the laser at the times that the changes were detected.

However, for advanced nodes and use of low voltages, thermal laser stimulation efficiency from faulty circuits becomes much lower due to the smaller dimensions in the metal line structures, high-level stacking layers, and sub-nano field effect transistor spaces. Hence, the identification and collection of hotspots become more challenging.

Figure 3:
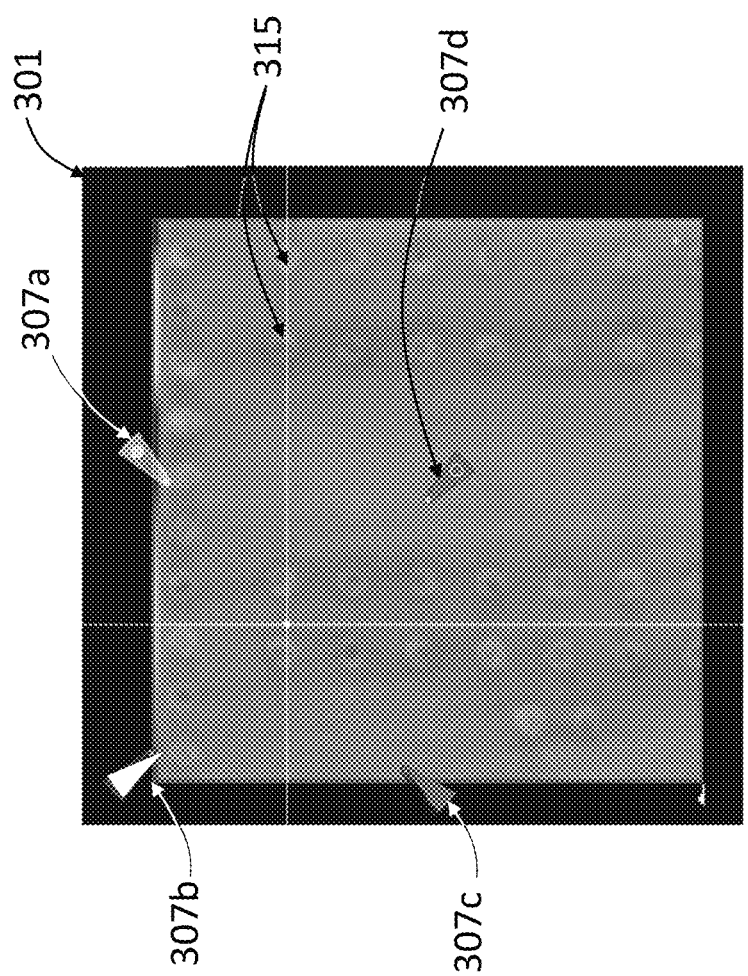
FIG. 3 shows a representative image of exemplary atomic force probes (AFP) scanning a DUT according to an aspect of the present disclosure.

FIG. 3 shows a representative image of an exemplary atomic force probe (AFP) unit with a plurality of scanning probes, i.e., four scanning probes 307a, 307b, 307c, and 307d scanning a DUT 301, according to an aspect of the present disclosure. The DUT 301 may have a plurality of 100 nm diameter contact vias 315 that may be scanned by the four scanning probes 307a, 307b, 307c, and 307d operating using tapping mode scanning to obtain the nano-range topography images. The atomic force probe (AFP) unit performs electrical probing to "turn on" a specific close loop circuit in the DUT 301.

Figures 4, 4A:
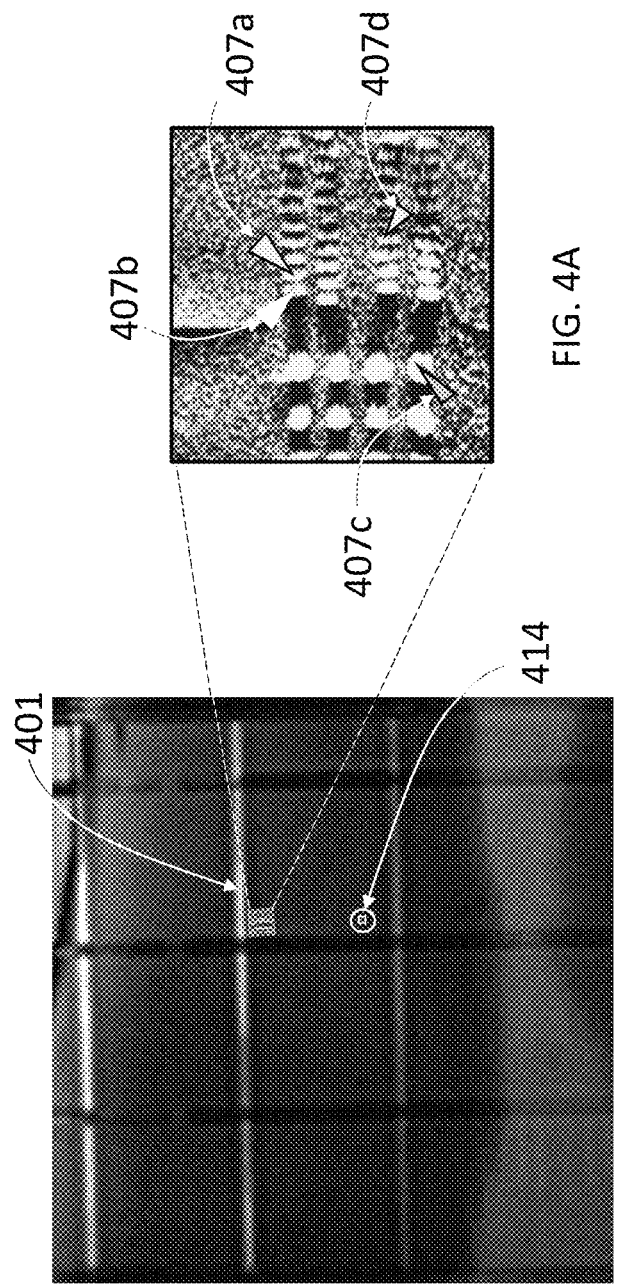
FIGS. 4 and 4A show a representative overlay of images for an optical thermal laser and an AFP for a DUT according to another aspect of the present disclosure.

FIGS. 4 and 4A show a representative overlay image for a DUT 401 using a present inspection tool (not shown) with integrated optical thermal laser stimulation and AFP units according to an aspect of the present disclosure. In FIG. 4, an optical thermal laser stimulation unit may be able to detect and pinpoint on the DUT 401 a hotspot 414 in the overlaying image in a static mode. In FIG. 4A, an expanded view shows four scanning probes 407a, 407b, 407c, and 407d performing scans and probes to produce biased circuitry and nano-range imaging that may be overlaid.

Figure 5:
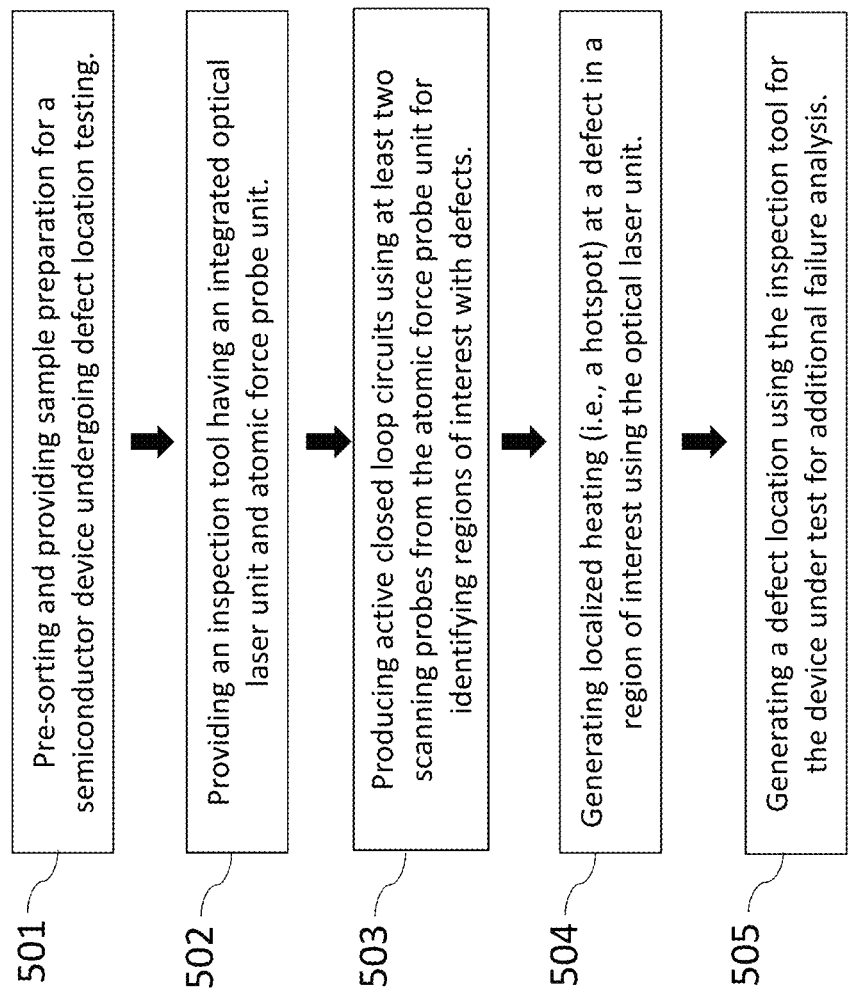
FIG. 5 shows a simplified flow diagram for an exemplary method according to a further aspect of the present disclosure.

FIG. 5 shows a simplified flow diagram for a further exemplary method according to a further aspect of the present disclosure, as described below.

The operation 501 may be directed to pre-sorting and providing sample preparation for a semiconductor device undergoing defect location testing.

The operation 502 may be directed to providing an inspection tool having an integrated optical thermal laser stimulation unit and an atomic force probe unit.

The operation 503 may be directed to producing active closed loop circuits using at least two scanning probes from the atomic force probe unit for identifying regions of interest with defects.

The operation 504 may be directed to generating localized heating (i.e., a hotspot) using the optical thermal laser stimulation unit.

The operation 505 may be directed to generating a defect location using the inspection tool for the device under test for additional failure analysis.

In an aspect, the present method uses an infrared laser scan to stimulate and detect the resistance-change (i.e., to produce hotspot) in a faulty circuitry in a device under test located in conjunction with atomic force probe nano-probing that may achieve up to 1.3 μm spatial resolution. The hotspots may be collected by using an infrared optical beam coupled with a high-sensitivity OBIRCH amplifier and overlaying/superimposing the hotspot image onto a high-resolution pattern image to localize the defect points. The pattern images may be used to generate a defect location, and the device under test may be provided with further failure analysis after fault isolation is completed.

It will be understood that any specific property described herein for a particular aspect of the integrated inspection tool may also generally hold for any of the other aspects thereof described herein. It will also be understood that any specific property described herein for a specific method may generally hold for any of the other methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present reticle assemblies and sensor assemblies, they will now be described by way of examples. For the sake of brevity, duplicate descriptions of features and properties may be omitted.

EXAMPLES

Example 1 provides an inspection tool including an optical laser unit for scanning a surface of a device under test, an atomic force probe unit for scanning the surface of the device under test, the atomic force probe unit comprising a detector unit for monitoring movements of a plurality of probes, a detector unit, and a processor coupled to the optical laser unit, the atomic force probe unit, and detector unit, for which the processor performs a fault location analysis and generates a map for a device under test.

Example 2 may include the inspection tool of example 1 and/or any other example disclosed herein, for which the optical laser unit includes a near-infrared laser.

Example 3 may include the inspection tool of example 1 and/or any other example disclosed herein, for which the optical laser unit includes a plurality of objective lenses that range in power from low to high magnification.

Example 4 may include the inspection tool of example 3 and/or any other example disclosed herein, for which the optical laser unit includes a magnification with submicron resolution.

Example 5 may include the inspection tool of example 1 and/or any other example disclosed herein, for which the atomic force probe unit includes piezoelectric scanning probes that operate using a tapping mode.

Example 6 may include the inspection tool of example 5 and/or any other example disclosed herein, for which the piezoelectric scanning probes comprise scanning probe microscope heads.

Example 7 may include the inspection tool of example 5 and/or any other example disclosed herein, for which the atomic force probe unit includes up to eight scanning probes.

Example 8 provides a method that includes conducting a first scan of a device under testing with an atomic force probe unit to determine locations of defects in the device under test, conducting a second scan of the device with an optical laser unit at a specific location determined by the atomic force probe unit to generate localized heating in the device under test, for which the localized heating is indicative of a specific defect in the device, and using the optical laser unit to perform a third scan of the specific location determined by the atomic force probe unit to obtain a specific location for the defect.

Example 9 may include the method of example 8 and/or any other example disclosed herein, for which the optical laser unit includes a low power lens and a high power lens, and the first scan is performed with the low power objective lens and the third scan is performed with the high power objective lens.

Example 10 may include the method of example 8 and/or any other example disclosed herein, for which the localized heating is due to an impedance change that is detectable by an optical beam induced resistance change amplifier.

Example 11 may include the method of example 8 and/or any other example disclosed herein, for which conducting the first scan with the atomic force probe unit includes producing an active closed loop circuit in the device under test using at least two scanning probes of the atomic force probe unit.

Example 12 may include the method of example 11 and/or any other example disclosed herein, further including placing the scanning probes on contact vias connected to the defect to activate the closed loop circuit.

Example 13 may include the method of example 11 and/or any other example disclosed herein, wherein conducting the first scan with the atomic force probe unit further includes scanning in a raster scanning pattern over the device under test using the two scanning probes.

Example 14 may include the method of example 11 and/or any other example disclosed herein, further includes tracking positions of the scanning probes using a detector unit.

Example 15 may include the method of example 8 and/or any other example disclosed herein, further including analyzing the first, second, and third scans to generate a map of the locations of the defects.

Example 16 may include the method of example 15 and/or any other example disclosed herein, further includes generating the map of the locations of the defects using a processor coupled to the optical laser unit, the atomic force probe unit, and the detector unit.

Example 17 may include the method of example 15 and/or any other example disclosed herein, further including locating defects at lower layers of the device under test by conducting the first, second, and third scans.

Example 18 may include the method of example 8 and/or any other example disclosed herein, further including identifying the device under test by a pre-sorting process and performing a sample preparation process for the device under test before performing the first scan.

Example 19 provides an inspection tool including an optical laser stimulation unit including a laser, and an optical system with a plurality of objective lenses, for which the optical laser stimulation unit generates a first scan image and final image, an atomic force probe unit including a laser, a photodiode, a plurality of scanning cantilever probes, a detector unit, and a feedback system, for which the atomic force probe unit generates a second scan image, and a processor coupled to the optical laser unit and the atomic force probe unit, for which the processor is configured to provide a fault location analysis for a device under test.

Example 20 may include the inspection tool of example 19 and/or any other example disclosed herein, for which the fault location analysis includes analyzing the scan images from the optical laser unit and the atom force probe unit to generate a map with the locations of the defects.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An inspection tool comprising:
   an optical thermal laser simulation unit configured to direct a laser beam to a surface of a device under test;
   an atomic force probe unit for scanning the surface of the device under test, the atomic force probe unit comprising a detector unit for monitoring movements of a plurality of probes; and
   a processor coupled to the optical thermal laser simulation unit, the atomic force probe unit, and detector unit, wherein the processor performs a fault location analysis and generates a map for a device under test.

2. The inspection tool of claim 1, wherein the optical thermal laser simulation unit comprises a near-infrared laser.

3. The inspection tool of claim 1, wherein the optical thermal laser simulation unit comprises a rotating lens attachment with a plurality of objective lenses that range in power from low to high magnification.

4. The inspection tool of claim 3, wherein the optical thermal laser simulation unit comprises a magnification with submicron resolution.

5. The inspection tool of claim 1, wherein the atomic force probe unit comprises piezoelectric scanning probes that operate using a tapping mode.

6. The inspection tool of claim 5, wherein the piezoelectric scanning probes comprise scanning probe microscope heads.

7. The inspection tool of claim 5, wherein the atomic force probe unit comprises up to eight scanning probes.

8. A method comprising:
   conducting a first scan of a device under testing with an atomic force probe unit to determine locations of defects in the device under test;
   conducting a second scan of the device with an optical laser unit at a specific location determined by the atomic force probe unit to generate localized heating in the device under test, wherein the localized heating is indicative of a specific defect in the device; and
   using the optical laser unit to perform a third scan of the specific location determined by the atomic force probe unit to obtain a specific location for the defect.

9. The method of claim 8, wherein the optical laser unit comprises a low power lens and a high power lens, and the first scan is performed with the low power objective lens and the third scan is performed with the high power objective lens.

10. The method of claim 8, wherein the localized heating is due to an impedance change that is detectable by an optical beam induced resistance change amplifier.

11. The method of claim 8, wherein conducting the first scan with the atomic force probe unit comprises producing an active closed loop circuit in the device under test using at least two scanning probes of the atomic force probe unit.

12. The method of claim 11, further comprises placing the scanning probes on contact vias connected to the defect to activate the closed loop circuit.

13. The method of claim 11, wherein conducting the first scan with the atomic force probe unit further comprises scanning in a raster scanning pattern over the device under test using the two scanning probes.

14. The method of claim 11, further comprises tracking positions of the scanning probes using a detector unit.

15. The method of claim 8, further comprises analyzing the first, second, and third scans to generate a map of the locations of the defects.

16. The method of claim 15, further comprises generating the map of the locations of the defects using a processor coupled to the optical laser unit, the atomic force probe unit, and the detector unit.

17. The method of claim 15, further comprises locating defects at lower layers of the device under test by conducting the first, second, and third scans.

18. The method of claim 8, further comprises identifying the device under test by a pre-sorting process and performing a sample preparation process for the device under test before performing the first scan.

19. An inspection tool comprising:
- an optical thermal laser stimulation unit comprising a near-IR laser and an optical system having a rotating lens attachment with a plurality of objective lenses, wherein the optical thermal laser stimulation unit generates a first scan image and final image;
- an atomic force probe unit comprising a laser, a photo-diode, a plurality of scanning cantilever probes, a detector unit, and a feedback system, wherein the atomic force probe unit generates a second scan image; and
- a processor coupled to the optical thermal laser stimulation unit and the atomic force probe unit, wherein the processor is configured to provide a fault location analysis for a device under test.

20. The inspection tool of claim 19, wherein the fault location analysis comprises analyzing the scan images from the optical thermal laser stimulation unit and the atom force probe unit to generate a map with the locations of the defects.

* * * * *